(«12») United States Patent
Minezawa et al.

(10) Patent No.: US 9,192,065 B2
(45) Date of Patent: Nov. 17, 2015

(54) ELECTRICAL DEVICE, CONTROL METHOD, AND PROGRAM

(75) Inventors: Satoshi Minezawa, Tokyo (JP);
Toshiyasu Higuma, Tokyo (JP);
Yoshiaki Koizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 296 days.

(21) Appl. No.: 13/813,173

(22) PCT Filed: Jan. 24, 2011

(86) PCT No.: PCT/JP2011/051253
§ 371 (c)(1),
(2), (4) Date: Jan. 30, 2013

(87) PCT Pub. No.: WO2012/023295
PCT Pub. Date: Feb. 23, 2012

(65) Prior Publication Data
US 2013/0120917 A1 May 16, 2013

(30) Foreign Application Priority Data

Aug. 18, 2010 (JP) .................... 2010-183088

(51) Int. Cl.
*H05K 7/00* (2006.01)
*G06F 1/32* (2006.01)
(Continued)

(52) U.S. Cl.
CPC *H05K 7/00* (2013.01); *G06F 1/325* (2013.01); *G06F 1/3265* (2013.01); *G08C 17/02* (2013.01); *H04N 5/4403* (2013.01);
(Continued)

(58) Field of Classification Search
CPC ........... G08C 2201/12; G08C 2201/32; H04N 2005/4428; H04N 21/42222
See application file for complete search history.

(56) References Cited

U.S. PATENT DOCUMENTS

2004/0046795 A1\* 3/2004 Josephson et al. ............ 345/764
2005/0174324 A1\* 8/2005 Liberty et al. ................. 345/156
(Continued)

FOREIGN PATENT DOCUMENTS

JP 06-250152 A 9/1994
JP 09-096533 A 4/1997
(Continued)

OTHER PUBLICATIONS

International Search Report of the International Searching Authority mailed Apr. 26, 2011 for the corresponding international application No. PCT/JP2011/051253 (with English translation).
(Continued)

*Primary Examiner* — Thomas Lee
*Assistant Examiner* — Chad Erdman
(74) *Attorney, Agent, or Firm* — Posz Law Group, PLC

(57) ABSTRACT

An acceleration sensor detects an acceleration. A timer measures elapsed time. A calculation means calculates jerk J of a remote controller on the basis of an acceleration detected by the acceleration sensor. A factor determination means determines whether a user is holding the remote controller in his/her hand on the basis of the change of the jerk J that is obtained from an index value calculated by the calculation means and an amount of time measured by the timer. A sleep control means turns on display of a display if the factor determination means determines that the user is holding the remote controller in his/her hand.

12 Claims, 10 Drawing Sheets

(51) Int. Cl.
*G08C 17/02* (2006.01)
*H04N 5/44* (2011.01)
*H04N 21/422* (2011.01)

(52) U.S. Cl.
CPC .. *H04N 21/42208* (2013.01); *H04N 21/42222* (2013.01); *G08C 2201/12* (2013.01); *G08C 2201/32* (2013.01); *H04N 2005/4408* (2013.01); *H04N 2005/4428* (2013.01); *Y02B 60/1242* (2013.01); *Y02B 60/32* (2013.01)

(56) References Cited

U.S. PATENT DOCUMENTS

| | | |
|---|---|---|
| 2006/0028446 A1* | 2/2006 | Liberty et al. ............ 345/158 |
| 2007/0028664 A1* | 2/2007 | Ukai .................... 73/1.37 |
| 2007/0054651 A1 | 3/2007 | Farmer et al. |
| 2007/0205982 A1 | 9/2007 | Ishidera et al. |
| 2008/0143675 A1* | 6/2008 | Hsieh et al. ............ 345/158 |
| 2009/0002217 A1 | 1/2009 | Kryze et al. |
| 2009/0128714 A1* | 5/2009 | Taya .................... 348/734 |
| 2010/0033422 A1 | 2/2010 | Mucignat et al. |
| 2010/0171635 A1* | 7/2010 | Chu .................. 340/825.69 |
| 2010/0253619 A1* | 10/2010 | Ahn .................... 345/157 |

FOREIGN PATENT DOCUMENTS

| | | |
|---|---|---|
| JP | 10-304480 A | 11/1998 |
| JP | 2000-047760 A | 2/2000 |
| JP | 2004-309162 A | 11/2004 |
| JP | 2006-227019 A | 8/2006 |
| JP | 2007-101406 A | 4/2007 |
| JP | 2007-128266 A | 5/2007 |
| JP | 2007-233753 A | 9/2007 |
| JP | 2009-033651 A | 2/2009 |
| JP | 2010-32176 A | 2/2010 |
| JP | 2010-166274 A | 7/2010 |

OTHER PUBLICATIONS

Office Action issued Dec. 2, 2014 for corresponding JP patent application No. 2014-079233 (with Partial English Translation).
Office Action mailed Feb. 12, 2014 issued in corresponding JP patent application No. 2012-529496 (and partial English translation).
Extended European Search Report dated May 8, 2014 issued in corresponding EP patent application No. 11817944.9.
Office Action issued Feb. 4, 2015 for corresponding CN patent application No. 201180039810.2 (with Partial English Translation).
Office Action issued Mar. 3, 2015 for corresponding JP patent application No. 2014-079233 (with Partial English Translation).
Office Action mailed Sep. 15, 2015 in the corresponding CN application No. 201180039810.2 (with English translation).

\* cited by examiner

ELECTRICAL DEVICE, CONTROL METHOD, AND PROGRAM

CROSS REFERENCE TO RELATED APPLICATIONS

This application is a U.S. national stage application of PCT/JP2011/051253 filed on Jan. 24, 2011, and is based on Japanese Patent Application No. 2010-183088 filed on Aug. 18, 2010, the disclosure of which is incorporated herein by reference.

TECHNICAL FIELD

The present invention relates to an electrical device, such as a hand-held remote controller, a control method, and a program.

BACKGROUND

A household electrical appliance such as an air conditioner or a television is provided with a remote controller, as an accessory, for remotely operating the household electrical appliance. A remote controller generally includes a liquid crystal display (LCD) and a backlight to display a temperature and humidity if the remote controller is for an air conditioner, for example.

In a conventional remote controller, if the temperature and humidity are always displayed, the battery power is wasted and the frequency of battery replacement and charge increases, increasing the work burden on the user.

Given that, a remote controller with a vibration sensor is disclosed (see, for example, Patent Literature 1). In this remote controller, once the vibration sensor detects a vibration caused by a user holding the remote controller in his/her hand, the LCD display is turned on, and then once a predetermined amount of time has passed after the user completes his/her operation, the LCD display is turned off. This reduces power consumed by the remote controller. Since the LCD display is turned on immediately after the vibration sensor detects that a user is holding the remote controller in his/her hand, operability is not impaired.

Meanwhile, a mobile terminal device that can differentiate the vibration caused by a user's running and walking and a dropping of the mobile terminal device is disclosed (see, for example, Patent Literature 2).

PRIOR ART LITERATURE

Patent Literature

Patent Literature 1: Unexamined Japanese Patent Application Kokai Publication No. H10-304480
Patent Literature 2: Unexamined Japanese Patent Application Kokai Publication No. 2007-101406

SUMMARY

However, in the remote controller disclosed in Patent Literature 1, the vibration sensor may falsely detect, for example, an impact that occurs when the remote controller hits against a floor or the like caused by an operation of the user. This false detection turns on the LCD display, which wastes power.

In the mobile terminal device disclosed in Patent Literature 2, dropping of the mobile terminal device and a vibration caused by a user's walking and running can be differentiated, but it is difficult to differentiate the vibration that occurs when a user holds the mobile terminal device in his/her hand and the vibration caused by the impact of dropping the mobile terminal device.

The present invention was made in view of the above circumstances and has an objective of providing an electrical device that can further reduce power consumption, a control method, and a program.

In order to achieve the above objective, the present invention provides an electrical device that a user uses in his/her hand. In this electrical device, an acceleration sensor detects an acceleration, a timer measures elapsed time, a calculator calculates an index value regarding movement of the electrical device on the basis of an acceleration detected by the acceleration sensor, a determiner determines whether the user is holding the electrical device in his/her hand on the basis of the change of an index value that is obtained from the index value calculated by the calculator and an amount of time measured by the timer, and an operation controller cancels the sleep state of the electrical device if the determiner determines that the user is holding the electrical device in his/her hand.

According to the present invention, if it is determined that the user is holding the electrical device in his/her hand on the basis of change of an index value regarding movement of the electrical device obtained from an acceleration detected by the acceleration sensor, or the like, the sleep state of the electrical device is canceled. This prevents the sleep state of the electrical device from being canceled for movement of the electrical device that occurs due to a different factor, such as a collision, thereby further reducing power consumption.

DETAILED DESCRIPTION

An embodiment of the present invention will be described in detail with reference to drawings.

(Configuration of Remote Controller)

Figure 1:
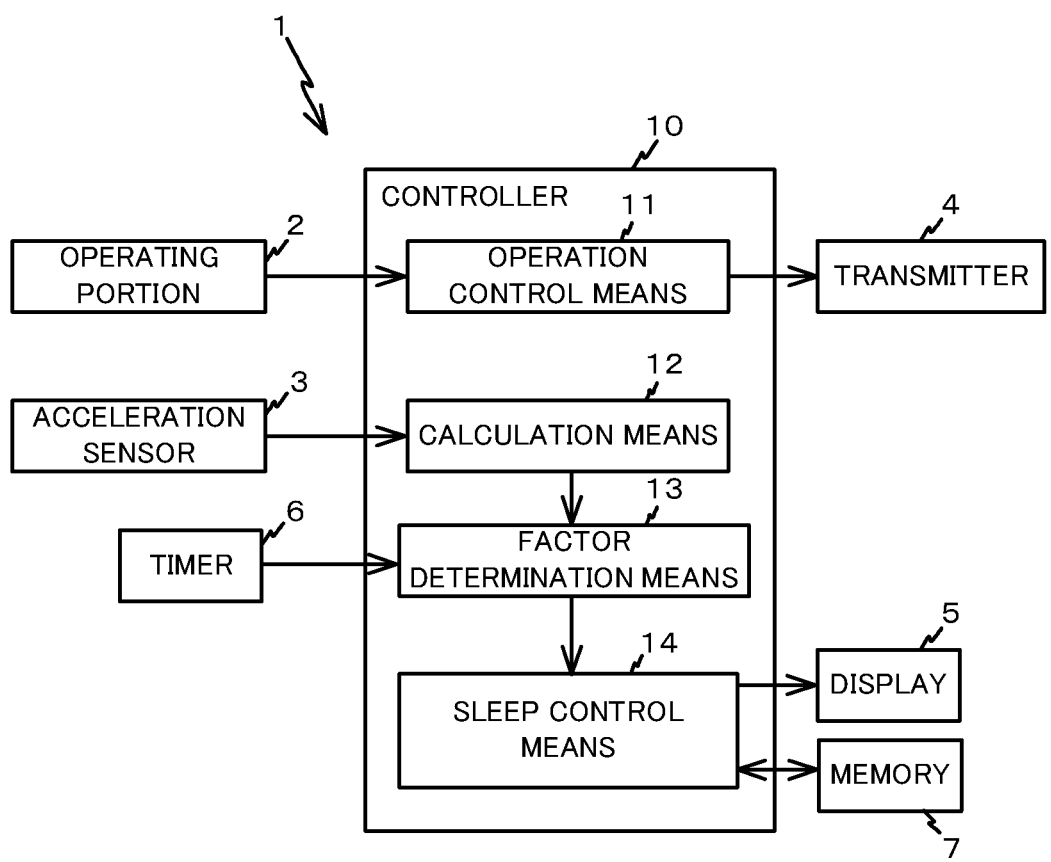
FIG. 1 is a block diagram illustrating a configuration of a remote controller according to an embodiment of the present invention.

FIG. 1 illustrates a configuration of a remote controller 1 according to an embodiment of the present invention. This remote controller 1 is an electrical device that a user generally uses in his/her hand. As illustrated in FIG. 1, the remote controller 1 includes an operating portion 2, an acceleration sensor 3, a transmitter 4, a display 5, a timer 6, a memory 7 and a controller 10.

The operating portion 2 is operated by the user and the user enters an operation input and then the operating portion 2 outputs an operation input signal corresponding to the entered operation input to the controller 10.

The acceleration sensor 3 detects an acceleration that occurs in the remote controller 1. The detected acceleration is output to the controller 10. The acceleration sensor 3 is preferably disposed at a predetermined distance (the farthest, if possible) from a gripper (not illustrated) of a housing that is gripped by the user's hand. Since the swing of the remote controller 1 is greater at a portion that is farther from the user's hand, the acceleration sensor 3 can detect a greater acceleration. The greater an acceleration detected by the acceleration sensor 3 becomes, the higher the calculation accuracy of the jerk J becomes, which will be described later.

The transmitter 4 transmits the operation signal (for example, an infrared signal) that corresponds to the operation input from the user and is output from the controller 10 externally. This signal is received by an appliance to be operated by the user, and the appliance operates according to the received signal.

The display 5 is a display provided with an LCD and a backlight. The display 5 displays information to be shown to the user under the control of the controller 10.

The timer 6 measures time under the control of the controller 10.

The memory 7 stores information displayed on the display 5 under the control of the controller 10.

The controller 10 integrally controls the above components of the remote controller 1. The controller 10 includes a central processing unit (CPU) and a memory (both are not illustrated). By the CPU's execution of a program stored in the memory, functions of the following components composing the controller 10 are implemented.

The controller 10 includes an operation control means 11, a calculation means 12, a factor determination means 13 and a sleep control means 14.

The operation control means 11 outputs an operation signal corresponding to an operation input signal entered from the operating portion 2 to the transmitter 4. The transmitter 4 transmits the operation signal externally.

The calculation means 12 calculates a rate of change of the acceleration (jerk J) that occurs in the remote controller 1, as an index value regarding movement of the remote controller 1, on the basis of the acceleration detected by the acceleration sensor 3.

A jerk J can be found from the difference between an acceleration detected by the acceleration sensor 3 and an acceleration detected by the acceleration sensor 3 at the previous sampling time, for example. In this embodiment, a jerk J is represented by an absolute value. That is because the same sign is used for threshold values that will be described later. If the threshold values are defined as positive and negative values, the jerk J does not need to be transformed to an absolute value.

The factor determination means 13 specifies a factor to change a jerk J on the basis of change of the jerk J that is obtained from the jerk J detected by the calculation means 12 and an amount of time measured by the timer 6. Factors to change the jerk J include a lifting of the remote controller 1 by the user, a collision of the remote controller 1 by being dropped, and a minute vibration (for example, vibration caused by a human's walking) of the remote controller 1.

Where a factor to change a jerk J is a lifting of the remote controller 1 by the user, the jerk J generally increases at the moment of lifting the remote controller 1, and increases again at the moment when movement of the remote controller 1 stops after the lifting (an acceleration greatly decreases). The amount of time between the lifting and the stoppage of movement of the remote controller 1 is about 100 milliseconds even if the remote controller 1 is quickly moved.

Similarly, when the remote controller 1 is placed on a desk or falls onto the floor, a great acceleration occurs in the remote controller 1. For example, when the remote controller 1 is placed on a desk, an acceleration of about 10 to 20 G (1G=9.8 m/s$^2$) occurs. When the remote controller 1 falls onto the floor, an acceleration of no less than several thousand G may occur. However, the amount of time of collision is for an instant, and the amount of time during which the jerk J greatly changes is shorter than the amount of time of lifting of the remote controller 1.

The factor determination means 13 determines whether the factor to change the jerk J is a lifting of the remote by the user, on the basis of such characteristics as the change of the jerk J. For this determination, as threshold values of the jerk J, two threshold values Th1 and Th2 are used as a first threshold value and a second threshold value, respectively.

The threshold value Th1 is a threshold value for detecting a jerk J at two timings: a moment when the remote controller 1 is lifted and a moment when movement of the remote controller 1 is stopped. If the jerk J exceeds the threshold value Th1, the remote controller 1 is moving due to some factor.

The threshold value Th2 is a threshold value for detecting a jerk J that occurs when the remote controller 1 hits against something. The threshold value Th2 is greater than the threshold value Th1.

In this embodiment, in order to determine the factors that change a jerk J of the remote controller 1, a time threshold value as a first period (Time 1), a time threshold value as a second period (Time 2), and a time threshold value as a third period (Time 3) are used.

The time threshold value Time 1 is a threshold value regarding an amount of time between the moment when the user lifts the remote controller 1 and the moment when movement of the remote controller 1 is stopped after the lifting. If the jerk J first exceeds the threshold value Th1, then decreases to less than the threshold value Th1 and remains without exceeding the threshold value Th1 again while the amount of time after the jerk J first exceeds the threshold value Th1 exceeds the time threshold value T1, the factor determination means 13 determines that the factor that changes the jerk J is not a lifting of the remote controller 1 by the user. In this embodiment the time threshold value Time 1 is three seconds, but the time threshold value Time 1 is not limited to three seconds.

The time threshold value Time 2 is a threshold value for differentiating a change of jerk J due to a lifting by the user and a change of jerk J due to a collision. The time threshold value Time 2 is shorter than the time threshold value Time 1. The time threshold value Time 2 is decided on the basis of an amount of time of change of a jerk J that occurs when the remote controller 1 hits against something. In this embodiment, the time threshold value Time 2 is 50 milliseconds, but the time threshold value Time 2 is not limited to 50 milliseconds.

The time threshold value Time 3 is a threshold value for differentiating a change of the jerk J due to stoppage of movement of the remote controller 1 after a lifting and a change of the jerk J due to a collision. The time threshold value Time 3 is decided on the basis of the amount of time of change of the jerk J that occurs when the remote controller 1 hits against something. In this embodiment the time threshold value Time 3 is 50 milliseconds, but the time threshold value Time 3 is not limited to 50 milliseconds.

Next, a method to determine a factor to change a jerk J using the above threshold values will be described in detail.

Figure 2:
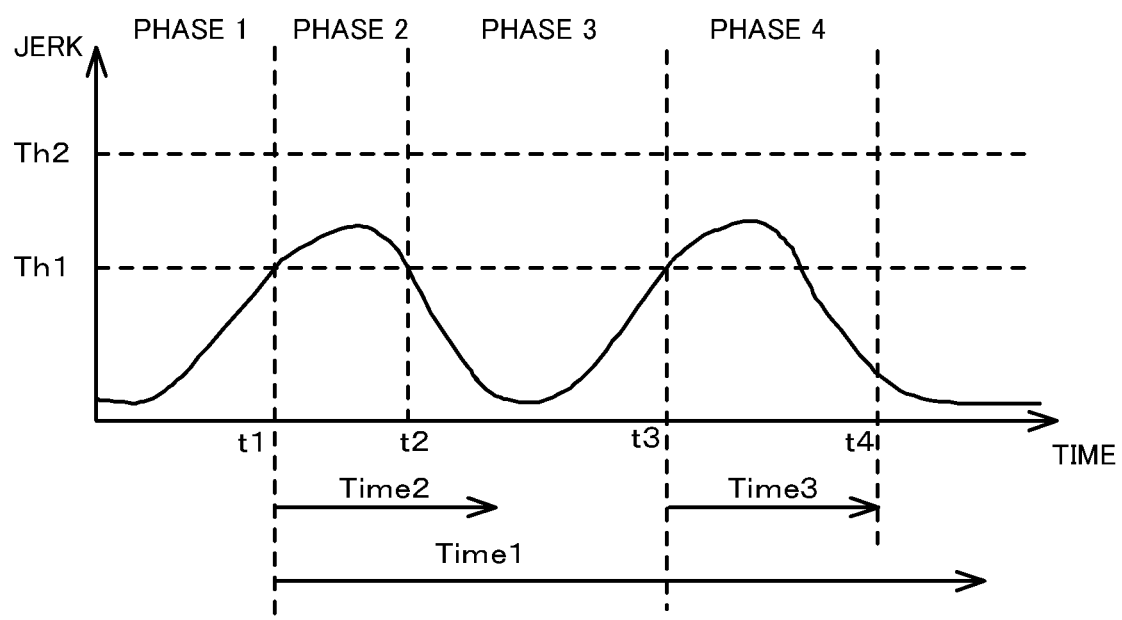
FIG. 2 is a graph illustrating one example of jerk over time when a user lifts a remote controller.

FIG. 2 illustrates one example of change of a jerk J with time when the user lifts the remote controller 1. As illustrated in FIG. 2, the jerk J increases at two timings: the moment when the user lifts the remote controller 1 and the moment when movement of the remote controller 1 is stopped after the lifting.

The factor determination means 13 specifies the factor to change the jerk J in such a way that change of the jerk J by a lifting of the remote controller 1 is divided into four phases, Phase 1 to Phase 4 as illustrated in FIG. 2 and processed.

(Phase 1)

The phase until the jerk J exceeds the threshold value Th1 is Phase 1. In Phase 1, the factor determination means 13 monitors whether the jerk J exceeds the threshold value Th1. In FIG. 2, at a time point t1 (a first time point), the jerk J exceeds the threshold value Th1. At this time point t1, the factor determination means 13 proceeds from Phase 1 to Phase 2.

(Phase 2)

In Phase 2, the factor determination means 13 starts to measure an amount of time. A measured amount of time is called T. The factor determination means 13 further monitors whether the jerk J exceeds the threshold value Th2 and whether the jerk J decreases to less than the threshold value Th1. In FIG. 2, the jerk J decreases less than the threshold value Th1 at a time point t2. At the time point t2, the factor determination means 13 proceeds from Phase 2 to Phase 3.

(Phase 3)

In Phase 3, the factor determination means 13 determines whether the jerk J exceeds the threshold value Th1 again. In FIG. 2, at a time point t3 (a second time point), the jerk J exceeds the threshold value Th1 again; and at the time point t3 the measured amount of time T exceeds the time threshold value Time 2. In such a case, the factor determination means 13 proceeds from Phase 3 to Phase 4.

(Phase 4)

In Phase 4, the factor determination means 13 determines whether the jerk J exceeds the threshold value Th2 within the time threshold value Time 3. In FIG. 2, after proceeding to Phase 4 at the time point t3, the time threshold value Time 3 has passed without the jerk J exceeding the threshold value Th2. In such a case, the factor determination means 13 determines that change of the jerk J is caused by a lifting of the remote controller 1 by the user.

(Collision Movement)

Figure 3:
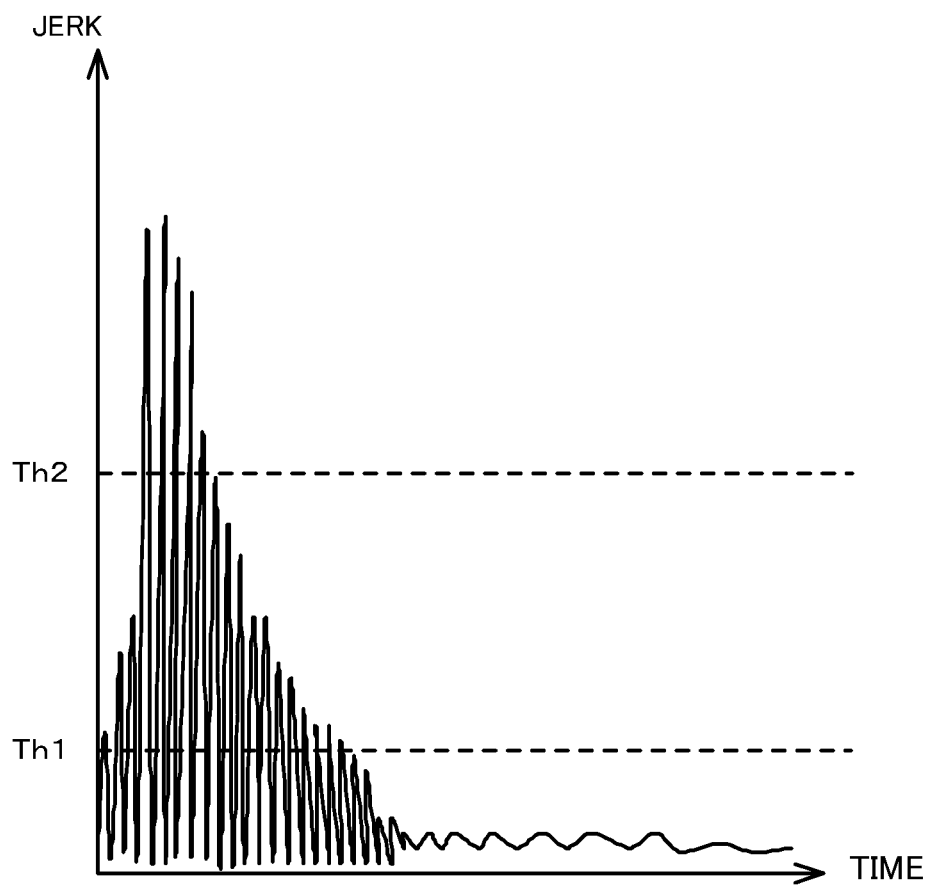
FIG. 3 is a graph illustrating one example of jerk over time when a remote controller hits against a floor.

FIG. 3 illustrates one example of change of a jerk J with time when the remote controller 1 hits against a floor. As illustrated in FIG. 3, when the remote controller 1 hits against a floor, a great jerk J occurs. Once the jerk J exceeds the threshold value Th1, the factor determination means 13 proceeds from Phase 1 to Phase 2. In Phase 2, if the jerk J exceeds the threshold value Th2, the factor determination means 13 determines that the factor that changes the jerk J is that the remote controller 1 has hit against something.

(Minute Vibration 1)

Figure 4:
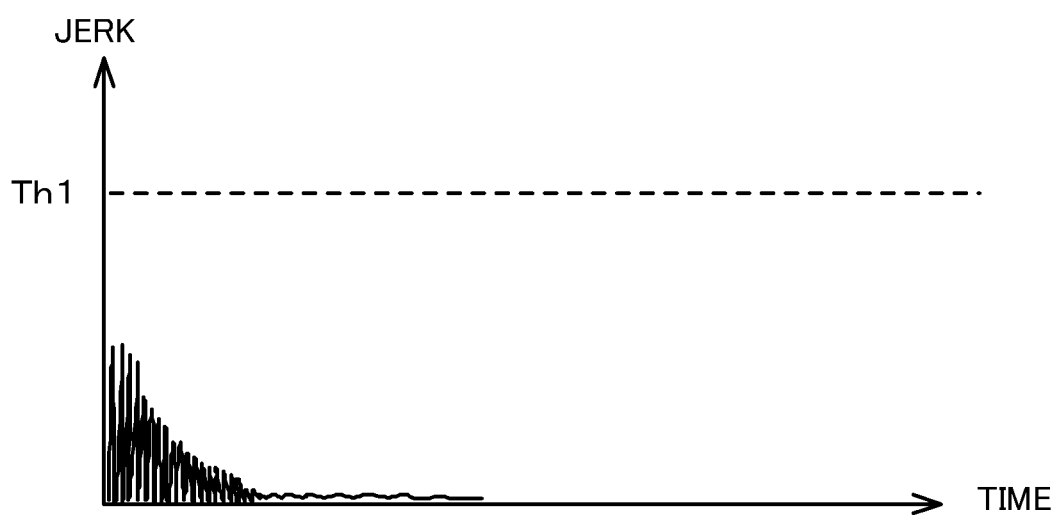
FIG. 4 is a graph illustrating one example of jerk over time when a minute vibration is applied to a remote controller.

FIG. 4 illustrates one example of change of a jerk J with time when a minute vibration is applied to the remote controller 1. When a minute vibration is applied to the remote controller 1, a vibration occurs with a small jerk J and a short vibration time. In FIG. 4, since the jerk J does not exceed the threshold value Th1, Phase 1 does not proceed to Phase 2.

(Minute Vibration 2)

Figure 5:
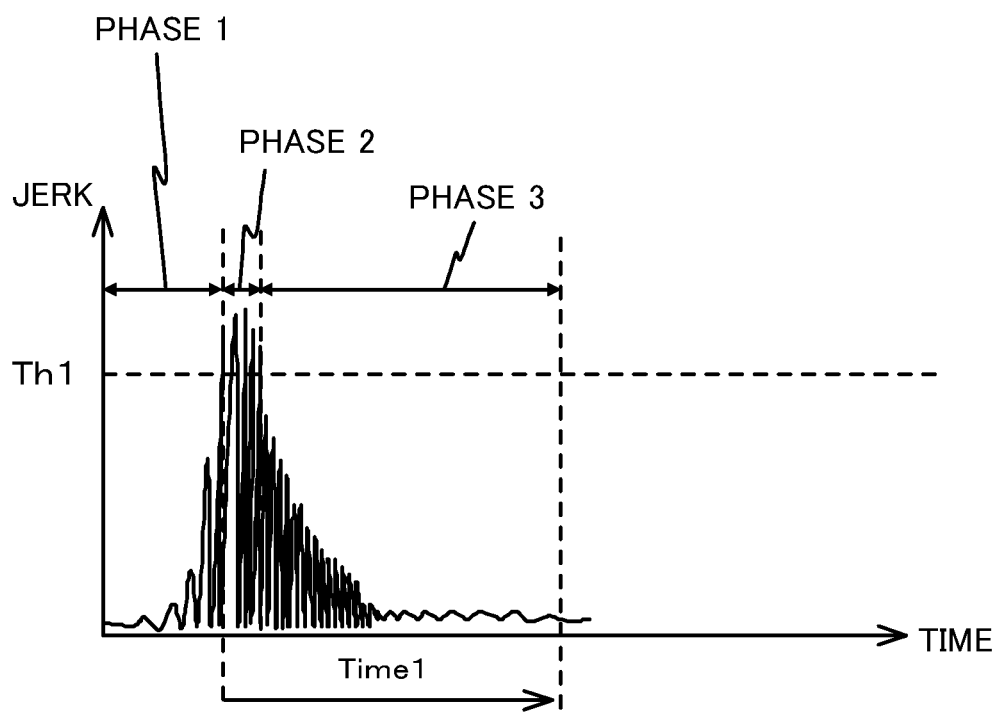
FIG. 5 is a graph illustrating one example of jerk over time where a minute vibration is applied to a remote controller.

FIG. 5 illustrates another example of a jerk J with time when a minute vibration is applied to the remote controller 1. In this example, since the jerk J exceeds the threshold value Th1, the factor determination means 13 proceeds from Phase 1 to Phase 2. Next, since the jerk J decreases to less than the threshold value Th1, the factor determination means 13 proceeds from Phase 2 to Phase 3. In Phase 3, since the time threshold value Time 1 has passed while the jerk J remains less than the threshold value Th1, the factor determination means 13 determines that the factor that changes the jerk J is a minute vibration.

Returning to FIG. 1, the sleep control means 14 sets or cancels the sleep state of the remote controller 1. The sleep control means 14 cancels the sleep state of the remote controller 1 if the factor determination means 13 determines that the user is holding the remote controller 1 in his/her hand. More specifically, the sleep control means 14 controls ON/OFF of the display of the display 5, for example. If display of the display 5 is turned off, that is, in the sleep state, power consumption can be reduced.

Once a predetermined period has passed after the user stops the operation of the remote controller 1, the sleep control means 14 turns off the LCD composing the display 5 of the remote controller 1, and if it is determined that the remote controller 1 is lifted, the sleep control means 14 turns on the LCD. The sleep control means 14 may turn on or off the backlight composing the display 5.

Next, operation of the remote controller 1 according to this embodiment will be described.

Figure 6:
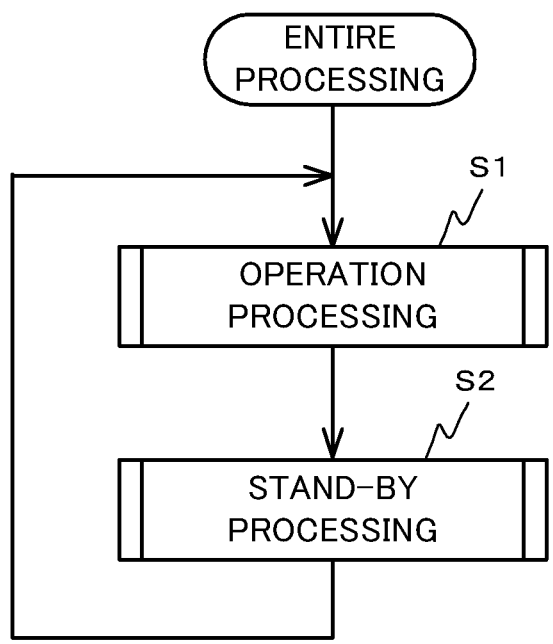
FIG. 6 is a flow chart of an entire processing of a controller of a remote controller.

FIG. 6 illustrates a flow chart of the entire processing of the remote controller 1. As illustrated in FIG. 6, after power activation, the controller 10 performs an operation processing subroutine to receive the operation from the user (Step S1). After that, the controller 10 performs a standby processing subroutine (Step S2). Then, the controller 10 repeats Steps S1 and S2.

Figure 7:
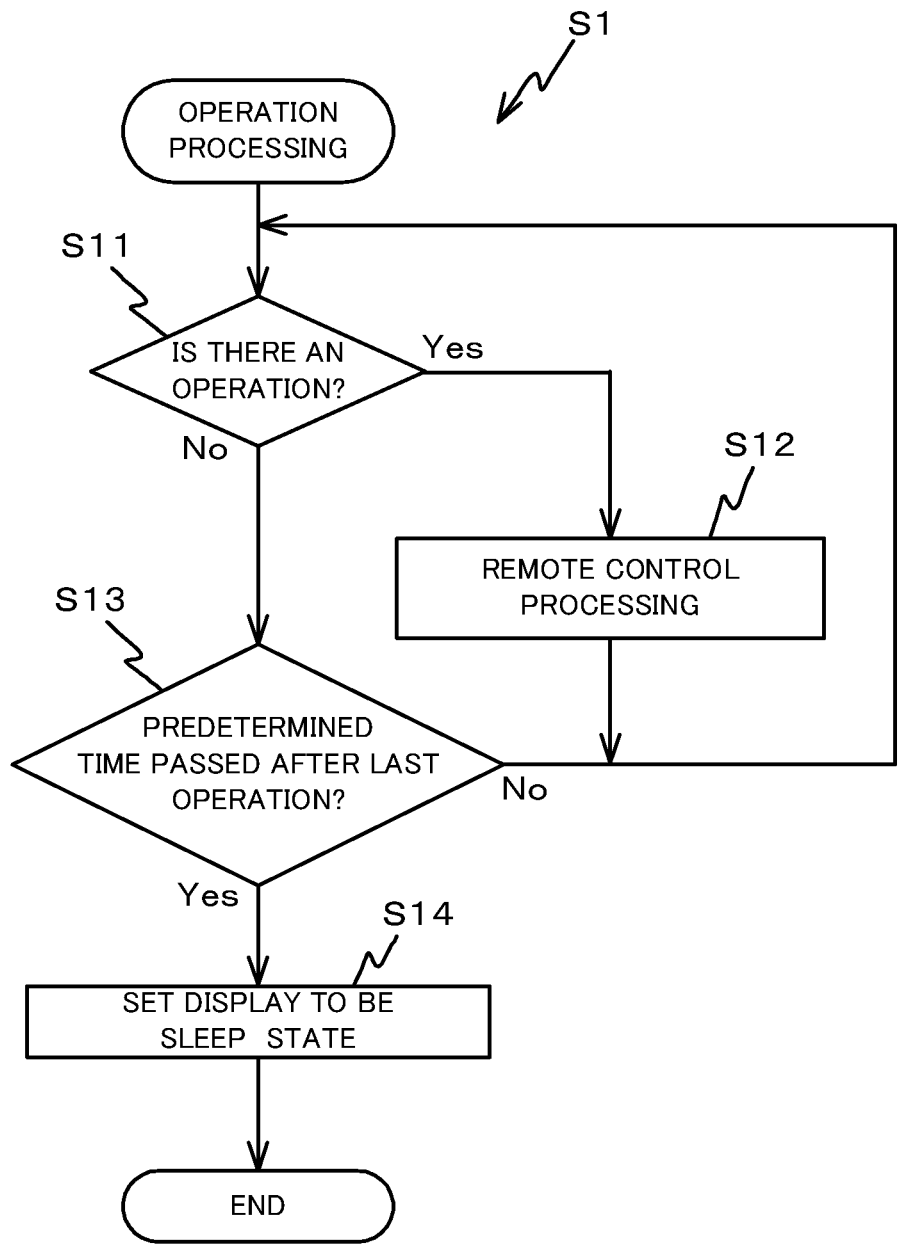
FIG. 7 is a flow chart of an operation processing subroutine.

FIG. 7 illustrates a flow chart of an operation processing subroutine. As illustrated in FIG. 7, the controller 10 first determines whether the user has performed an operation (Step S11). Here, an operation by the user includes a press of an input button or a voice input.

If the user enters an operation input (Step S11; Yes), the operation control means 11 performs remote control processing corresponding to the operation input (Step S12). For example, where an appliance to be operated by the user is an air conditioner, when the user presses a power button, the remote controller 1 transmits a power-on signal to the air conditioner, thereby turning on the air conditioner. After remote control processing, the controller 10 returns processing to Step S11.

Meanwhile, if there is no operation input from the user (Step S11; No), the controller 10 determines whether a predetermined amount of time (for example, 30 seconds) has passed after the last operation by the user (Step S13). For example, if no user operation is performed after power activation, the amount of time to be determined is the amount of time after the power activation. If a predetermined amount of time has not passed yet (Step S13; No), the controller 10 returns processing to Step S11.

If a predetermined amount of time has passed after the last operation by the user (Step S13; Yes), it is determined that a user operation has been completed, and the sleep control means 14 sets the display 5 to be in the sleep state (display is OFF) (Step S14). Here, the sleep control means 14 stores information displayed on the display 5 in the memory 7. After Step S14, the controller 10 terminates the operation processing subroutine.

Figure 8:
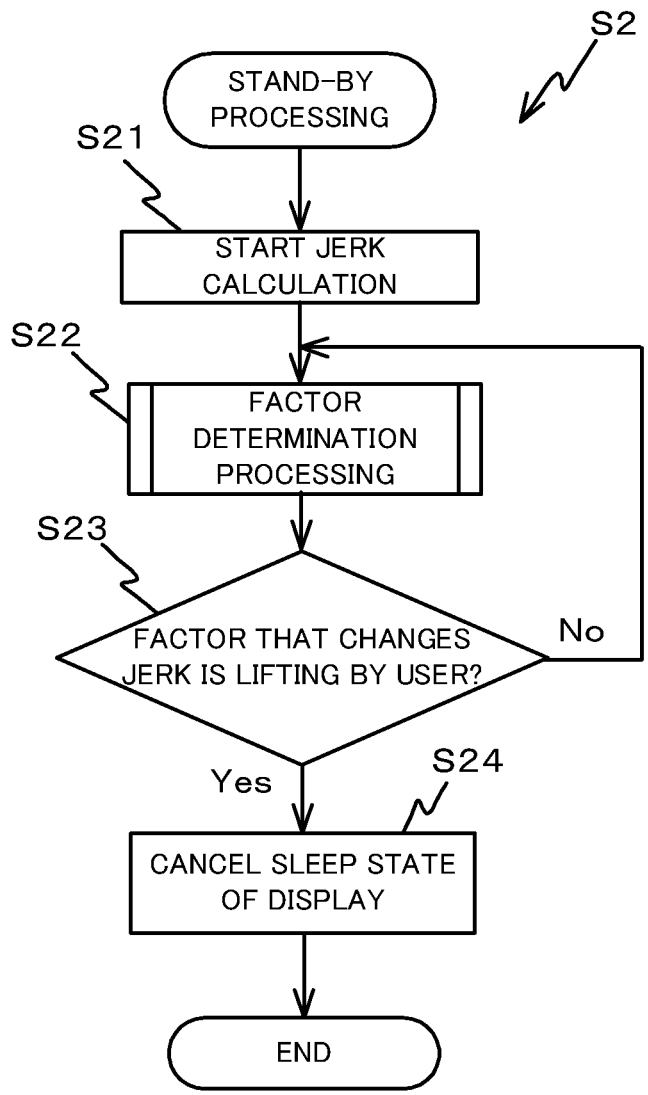
FIG. 8 is a flow chart of a standby processing subroutine.

FIG. 8 illustrates a flow chart of a stand-by processing subroutine S2. As illustrated in FIG. 8, the calculation means 12 first starts to calculate a jerk J (Step S21). After that, the calculation means 12 calculates the jerk J on the basis of an acceleration to be output from the acceleration sensor 3 at regular intervals.

Subsequently, the factor determination means 13 performs a factor determination processing subroutine to determine the factor that changes the jerk J (Step S22). This factor determination processing subroutine will be described later.

Next, the factor determination means 13 determines whether the factor that changes the jerk J, which was subjected to the factor determination processing subroutine, is a lifting by the user (Step S23). If it is determined that the factor that changes the jerk J is not a lifting by the user (Step S23; No), the factor determination means 13 returns processing to Step S22. After that, until it is determined that the factor that changes the jerk J is a lifting by the user (Step S23; Yes), Steps S22 and S23 will be repeated.

Meanwhile, if it is determined that the factor that changes the jerk J is a lifting by the user (Step S23; Yes), the sleep control means 14 cancels the sleep state of the display 5 and turns on display of the display 5 (Step S24). The sleep control means 14 reads out information stored in the memory 7 and causes the display 5 to display the information. Information to be displayed on the display 5 may be different information, and immediately after power activation, an image of default setting may be displayed. Then, calculation of the jerk J by the calculation means 12 is terminated.

The user may operate the remote controller 1 without lifting the remote controller 1. For example, the user may press a button of the remote controller 1 without touching the housing of the remote controller 1. In this case, it is desirable that the controller 10 can perform remote controller processing of Step S12 by interrupting the processing even if the display 5 is in the sleep state.

Figure 9:
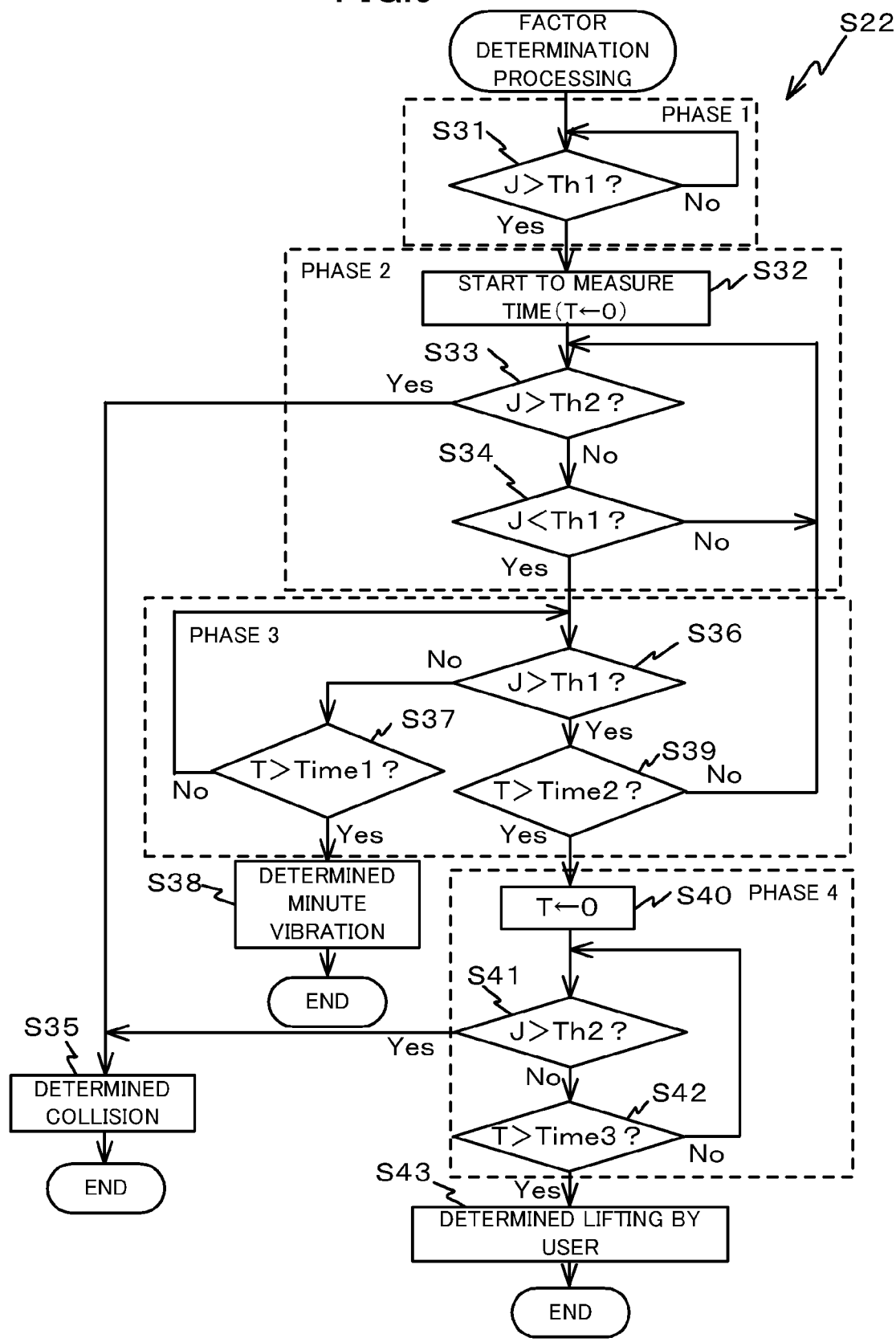
FIG. 9 is a flow chart of a factor determination processing subroutine.

FIG. 9 illustrates a flow chart of a factor determination processing subroutine to determine a factor to change a jerk J. This subroutine is divided into four phases from Phases 1 to 4, as described above.

As illustrated in FIG. 9, in Phase 1, the factor determination means 13 waits until the jerk J exceeds the threshold value Th1 (Step S31; No).

Once the jerk J exceeds the threshold value Th1 (Step S31; Yes), the factor determination means 13 proceeds to Phase 2. In Phase 2, the factor determination means 13 starts to measure time after the jerk J exceeds the threshold value Th1 (Step S32). That is, at this point, measured time T=0.

Next, the factor determination means 13 determines whether the jerk J further increases to exceed the threshold value Th2 (Step S33).

If the jerk J exceeds the threshold value Th2 (Step S33; Yes), the factor determination means 13 determines that the remote controller has hit against something (Step S35). After Step S35, the factor determination means 13 terminates the factor determination processing subroutine.

Meanwhile, if the jerk J does not exceed the threshold value Th2 (Step S33; No), the factor determination means 13 determines whether the jerk J decreases to less than the threshold value Th1 again (Step S34). If the jerk J does not decrease to less than the threshold value Th1 (Step S34; No), the factor determination means 13 returns to Step S33. In this way, until the jerk J exceeds the threshold value Th2 (Step S33; Yes) or decreases to less than the threshold value Th1 (Step S34; Yes), Steps S33 and S34 will be repeated.

If the jerk J decreases to less than the threshold value Th1 (Step S34; Yes), the factor determination means 13 proceeds to Phase 3. In Phase 3, the factor determination means 13 determines whether the jerk J exceeds the threshold value Th1 again (Step S36). If the jerk J does not exceed the threshold value Th1 (Step S36; No), the factor determination means 13 determines whether the time threshold value Time 1 has passed (Step S37). If the time threshold value Time 1 has not passed (Step S37; No), the factor determination means 13 returns processing to Step S36.

If the time threshold value Time 1 has passed (Step S37; Yes), the factor determination means 13 determines that the factor that changes the jerk J is a minute vibration that is not caused by a lifting by the user (Step S38) and terminates factor determination processing subroutine.

If the jerk J exceeds the threshold value Th1 (Step S36; Yes), the factor determination means 13 determines whether the measured amount of time T exceeds the time threshold value Time 2 (Step S39). If the measured amount of time T does not exceed the time threshold value Time 2 (Step S39; No), the factor determination means 13 returns processing to Step S33.

Meanwhile, if the measured amount of time T exceeds the time threshold value Time 2 (Step S39; Yes), the factor determination means 13 sets the point at which the jerk J exceeds the threshold value Th1 (the second time point) to be T=0 (Step S40). After that, the factor determination means 13 determines whether the jerk J exceeds the threshold value Th2 (Step S41). If it is determined that the jerk J exceeds the threshold value Th2 (Step S41; Yes), the factor determination means 13 determines that the factor that changes the jerk J is caused by a collision (Step S35) and terminates factor determination processing subroutine.

Meanwhile, if it is determined that the jerk J does not exceed the threshold value Th2 (Step S41; No), the factor determination means 13 determines whether the measured amount of time T from the second time point exceeds the time threshold value Time 3 (Step S42). If the measured amount of time T does not exceed the time threshold value Time 3 (Step S42; No), the factor determination means 13 returns processing to Step S41.

Meanwhile, if it is determined that the measured amount of time T exceeds the time threshold value Time 3 (Step S42; Yes), the factor determination means 13 determines that the factor that changes the jerk J is a lifting of the remote controller 1 by the user (Step S43) and terminates factor determination processing subroutine.

The above factor determination processing subroutine is summarized as below.

If the jerk J exceeds the threshold value Th1 at the time point t1 and then decreases to less than the threshold value Th1 and remains without exceeding the threshold value Th1 again while the amount of time from the time point t1 exceeds the time threshold value Time 1 (Step S37; Yes), the factor determination means 13 determines that the user is not holding the remote controller 1 in his/her hand (Step S38).

Further, if, after the time point t1, the jerk J exceeds the threshold value Th2 without decreasing to less than the threshold value Th1 or the jerk J exceeds the threshold value Th2 by the time threshold value Time 2 has passed (Step S33; Yes), the factor determination means 13 determines that the user is not holding the remote controller 1 in his/her hand (Step S35).

Further, if the jerk J exceeds the threshold value Th1 at the time point t1, then decreases to less than the threshold value Th1 and exceeds the threshold value Th1 again while the amount of time from the time point t1 to the point of exceeding the threshold value Th1 again exceeds the time threshold value Time 2 (Step S39; Yes) but the jerk J exceeds the threshold value Th2 by the time threshold value Time 3 has passed since the time point t3 (Step S41; Yes), the factor determination means 13 determines that the user is not holding the remote controller 1 in his/her hand (Step S35).

That is, if the jerk J exceeds the threshold value Th1 at the time point t1, then decreases to less than the threshold value Th1 and exceeds the threshold value Th1 again and the amount of time from the time point t1 to the point of exceeding the threshold value Th1 again is within the time threshold value Time 1 and beyond the time threshold value Time 2 (Step S39; Yes), and if the jerk J does not exceed the threshold value Th2 until the time threshold value Time 3 has passed from the time point t3 (Step S42; Yes), the factor determination means 13 determines that the user is holding the remote controller 1 in his/her hand (Step S43).

The factor determination means 13 may always determine that the user is not holding the remote controller 1 in his/her hand if the jerk J exceeds the threshold value Th2.

As described in detail above, in this embodiment, if it is determined that the user is holding the remote controller 1 in his/her hand on the basis of a change of the jerk J regarding movement of the remote controller 1 that is obtained from an acceleration detected by the acceleration sensor 3, the sleep state of the display 5 is cancelled. This prevents the sleep state from being cancelled for movement of the remote controller 1 caused by a different factor such as a collision, thereby further reducing power consumption.

The remote controller 1 of an air conditioner is usually placed on a desk or the like, and when the air conditioner is used, the user generally operates the remote controller 1 in his/her hand. In this embodiment, while the remote controller 1 is not being operated, display of the display 5 is off, and when it is determined that the user is holding the remote controller 1 in his/her hand, display of the display 5 is turned on. This allows for the same operability as that of continuous display of the remote controller 1 and also can reduce power consumption. As a result, the frequency of replacement and charge of the battery of the battery-driven remote controller 1 can be reduced.

In this embodiment, a lifting of the remote controller 1 has been described. In a case where the remote controller 1 is pulled down from above, since change of the jerk J is almost the same as that of the lifting, the same effect can be obtained.

In this embodiment, the jerk J is used as an index value regarding movement of the remote controller 1. This enables the lifting of the remote controller 1 by the user to be determined with a high degree of accuracy, regardless of the posture of the remote controller 1, that is, an orientation of gravity.

In this embodiment, during operation of the remote controller 1 (while the user is operating the remote controller 1), calculation of the jerk J and determination of the factor that changes the jerk J are not performed. This further reduces power consumption that would be required to calculate the jerk J and determine the factor that changes the jerk J. The sleep control means 14 may stop operation of the acceleration sensor 3 and/or timer 6 if the electrical device is not in the sleep state.

At least one of the threshold values Th1 and Th2 and time threshold values Time 1 and Time 2 and Time 3 may be adjustable. In this case, the adjustment is preferably performed according to the shape, weight and use of the remote controller 1. This permits more accurately the detection that the user is holding the remote controller 1 in his/her hand.

Intervals between calculations of a jerk J may be adjustable. For example, where the controller 10 has a learning function, if a jerk is not detected for a long time, intervals between calculations of the jerk J may be longer. This can curb useless detection of a jerk J, further reducing power consumption.

In this embodiment, a lifting of the remote controller 1 is determined using the rate of the jerk J and the amount of time of change, but the frequency of the jerk J can be used. In this case, for example, the factor determination means 13 is subjected to a waveform of the jerk J to Fourier transformation to obtain a frequency characteristic. Further, the factor determination means 13 determines the lifting of the remote controller on the basis of the difference in frequency between the lifting and the collision of the remote controller 1. For example, the factor determination means 13 determines that the remote controller 1 is lifted by the user if both frequencies at the moment when the jerk J exceeds the threshold value Th1 twice are lower than the frequency threshold value Fth.

That is, the factor determination means 13 may determine that the user is not holding the remote controller 1 in his/her hand if the frequency component of the jerk J3 during the time threshold value Time 2 from the time point t1 and during the time threshold value Time 3 from the time point t3 includes a component higher than the frequency threshold value Fth. By using the frequency component of the jerk J in this way, the same effect as that of the above embodiment can be obtained.

Although a jerk J is used as an index value for determining a lifting of the remote controller 1, an acceleration can be used as an index value. In this case, a gravity acceleration is stored, the calculation means 12 calculates the acceleration by subtracting the gravity acceleration from the acceleration detected by the acceleration sensor 3, and using the calculated acceleration as an index value to perform determination. This allows for the same effect as the above embodiment in determination with the use of an acceleration.

Figure 10:
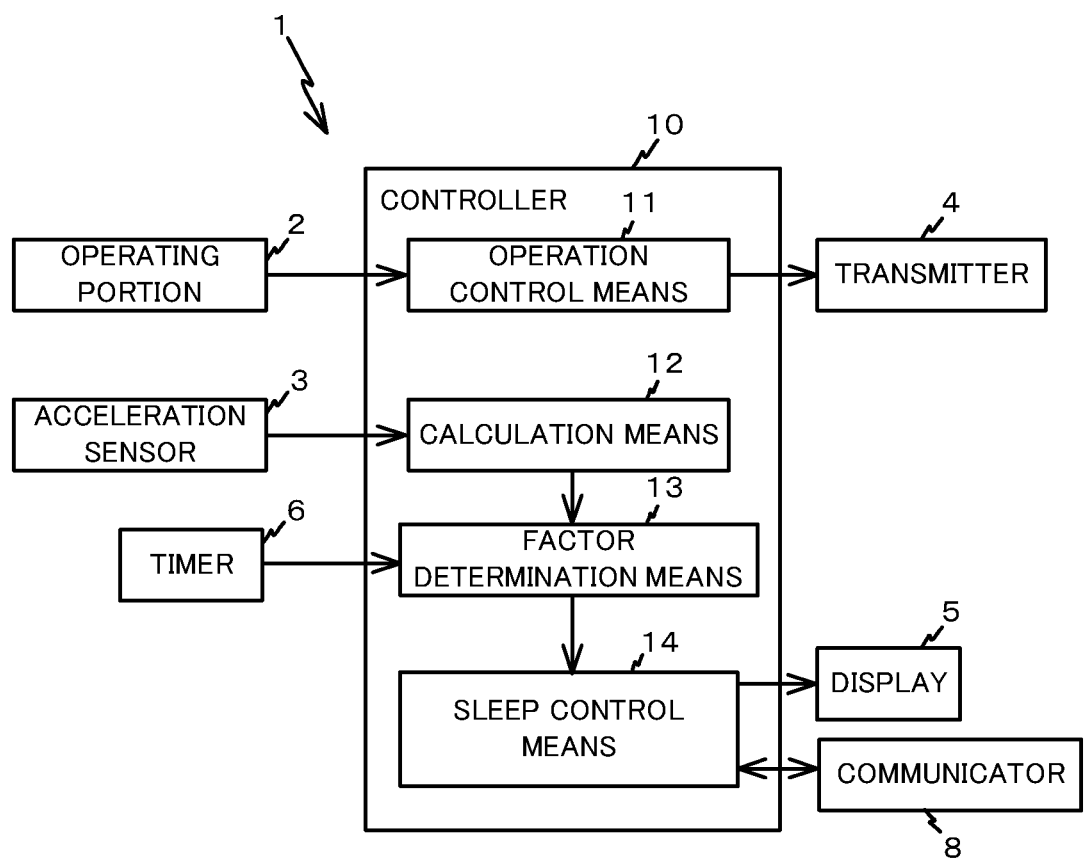
FIG. 10 is a block diagram illustrating another configuration of the remote controller in FIG. 1.

FIG. 10 illustrates another configuration of the remote controller 1. As illustrated in FIG. 10, this remote controller 1 further includes a communicator 8 instead of the memory 7.

The communicator 8 communicates with an external device to receive information under the control of the sleep control means 14 when the sleep state of the remote controller 1 is cancelled. The sleep control means 14 causes the display 5 to display information the communicator 8 received from the external device when it is detected that the user is holding the remote controller 1 in his/her hand. In this way, information on operation can be obtained between the time when the user is holding the remote controller 1 in his/her hand and the time when the user starts to operate the remote controller 1, and the information is on the display 5 when the user actually operates the remoter controller 1.

The sleep control means 14 may cause a component, such as the operating portion 2, transmitter 4 and communicator 8, except the display 5, to be in the sleep state.

The controller 10 may detect a failure of the acceleration sensor 3. For example, if the acceleration sensor 3 has failed, then output acceleration may not change. The controller 10 determines that the acceleration sensor 3 has failed if the acceleration output from the acceleration sensor 3 does not change when the remote controller 1 is being operated, for example. In this way, a failure of the acceleration sensor 3 can be promptly detected, and thus a failure of the remote controller 1 can be addressed immediately.

In this embodiment, the case where the remote controller 1 is used has been described. However, the present invention can be applied to a case other than where the remote controller 1 is used. The present invention can be applied to any electrical device as long as the electrical device requires a display function when the user is operating the electrical device and does not require a display function when the user is not operating the electrical device. Such a device could include, for example an electronic calculator or a mobile phone.

A program to be executed in the above embodiment may be stored and distributed in a computer-readable recording medium such as a flexible disk, a compact disk read-only memory (CD-ROM), a digital versatile disk (DVD) and a magneto-optical disk (MO), and by installing the program, a system to perform the above processing may be configured.

Alternatively, a program may be stored in a disk device or the like in a predetermined server device on a communication network such as the Internet, and be downloaded, for example, by superimposing the program on carrier waves.

Where the above functions are implemented by being shared by an operating system (OS) or where the above functions are implemented by cooperation of OS and an application, only that part other than OS may be stored and distributed in a medium or be downloaded.

The present invention is not limited by the above embodiment and drawings. It should be appreciated that the embodiment and drawings can be modified without departing from the principle of the present invention.

INDUSTRIAL APPLICABILITY

The present invention is suitable for an electrical device, such as a remote controller, that a user uses in his/her hand.

The invention claimed is:

1. An electrical device that a user uses in his/her hand comprising:
   an acceleration sensor configured to detect an acceleration;
   a timer configured to measure elapsed time;
   a calculator configured to calculate an index value regarding movement of the electrical device on the basis of an acceleration detected by the acceleration sensor;
   a determiner configured to determine whether the user is holding the electrical device on the basis of change of the index value that is obtained from the index value calculated by the calculator and an amount of time measured by the timer; and
   an operation controller configured to cancel a sleep state of the electrical device if the determiner determines that the user is holding the electrical device in his/her hand, and wherein
   the determiner determines that the user is not holding the electrical device in his/her hand,
      if the index value exceeds a first threshold value at a first time point, then decreases to less than the first threshold value and remains without exceeding the first threshold value again while the amount of time after the first time point exceeds a first period, the first period being a predetermined time threshold, and
      if the index value exceeds a second threshold value greater than the first threshold value without decreasing to less than the first threshold value after the first time point, or if the index value exceeds the second threshold value by the time a second period shorter than the first period has passed after the first time point,
   the determiner determines that the user is holding the electrical device in his/her hand,
      if the index value exceeds the first threshold value at the first time point, then decreases to less than the first threshold value and exceeds the first threshold value again and the amount of time from the first time point to a point of exceeding the first threshold value again is within the first period and longer than the second period that is shorter than the first period, and
      if the index value does not exceed the second threshold value greater than the first threshold value.

2. The electrical device according to claim 1, wherein the determiner determines that the user is not holding the electrical device in his/her hand,
   if the index value exceeds the first threshold value at the first time point, then decreases to less than the first threshold value and exceeds the first threshold value again at a second time point while the amount of time from the first time point to the second time point exceeds the second period, and
   if the index value exceeds the second threshold value by the time a third period shorter than the first period has passed since the second time point.

3. The electrical device according to claim 1, wherein the determiner further determines that the user is not holding the electrical device in his/her hand,
   if the index value exceeds the second threshold value greater than the first threshold value.

4. The electrical device according to claim 1, wherein the determiner further determines that the user is not holding the electrical device in his/her hand,
   if a frequency component of the index value includes a component higher than a predetermined threshold value.

5. The electrical device according to claim 1, wherein at least one of the respective threshold values, the respective periods, and an interval between calculations of the index value by the calculator can be adjusted.

6. The electrical device according to claim 1, wherein the index value regarding movement of the electrical device is either jerk that is the rate of change of the acceleration detected by the acceleration sensor, or a value obtained by subtracting the gravity acceleration from the acceleration detected by the acceleration sensor.

7. The electrical device according to claim 1, wherein the operation controller stops operation of at least one of the acceleration sensor, the timer, the calculator or the determiner where the electrical device is not in the sleep state.

8. The electrical device according to claim 1, further comprising:
   a display configured to display information;
   a communicator configured to communicate with an external device to receive information when the sleep state of the electrical device is cancelled; and
   an operating portion configured to be operated by the user,
   wherein the operation controller
      causes the electrical device to be in the sleep state once a predetermined amount of time has passed since an operation by the operating portion stops, and
      causes the display to display information received by the communicator when the sleep state of the electrical device is cancelled.

9. The electrical device according to claim 1, further comprising:
   a gripper configured to be gripped by the user,
   wherein the acceleration sensor is disposed in a predetermined distance from the gripper.

10. The electrical device according to claim 1, further comprising:
a failure detector configured to detect a failure of the acceleration sensor on the basis of an acceleration detected by the acceleration sensor.

11. A method of controlling an electrical device that a user uses in his/her hand, the method comprising:
a calculation step to calculate an index value regarding movement of the electrical device on the basis of an acceleration detected by an acceleration sensor in the electrical device;
a determination step to determine whether the user is holding the electrical device in his/her hand on the basis of change of the index value that is obtained from the index value calculated at the calculation step and an amount of time measured by a timer; and
an operation control step to cancel a sleep state of the electrical device if it is determined that the user is holding the electrical device in his/her hand at the determination step, and wherein
in the determination step, determines that the user is not holding the electrical device in his/her hand,
if the index value exceeds the first threshold value at a first time point, then decreases to less than the first threshold value and remains without exceeding the first threshold value again while the amount of time after the first time point exceeds a first period, the first period being a predetermined time threshold, and
if the index value exceeds a second threshold value greater than the first threshold value without decreasing to less than the first threshold value after the first time point, or if the index value exceeds the second threshold value by the time a second period shorter than the first period has passed after the first time point,
in the determination step, determines that the user is holding the electrical device in his/her hand,
if the index value exceeds the first threshold value at the first time point, then decreases to less than the first threshold value and exceeds the first threshold value again and the amount of time from the first time point to a point of exceeding the first threshold value again is within the first period and longer than the second period that is shorter than the first period, and
if the index value does not exceed the second threshold value greater than the first threshold value.

12. A non-transitory computer-readable medium comprising instructions for execution by a computer to control an electrical device that a user uses in his/her hand to function to:
calculate an index value regarding movement of the electrical device on the basis of an acceleration detected by an acceleration sensor in the electrical device;
determine whether the user is holding the electrical device in his/her hand on the basis of change of the index value that is obtained from the index value that is calculated and an amount of time measured by a timer; and
cancel a sleep state of the electrical device if the user is determined to be holding the electrical device in his/her hand, and wherein
the user is determined to be not holding the electrical device in his/her hand,
if the index value exceeds the first threshold value at a first time point, then decreases to less than the first threshold value and remains without exceeding the first threshold value again while the amount of time after the first time point exceeds a first period, the first period being a predetermined time threshold, and
if the index value exceeds a second threshold value greater than the first threshold value without decreasing to less than the first threshold value after the first time point, or if the index value exceeds the second threshold value by the time a second period shorter than the first period has passed after the first time point,
the user is determined to be holding the electrical device in his/her hand,
if the index value exceeds the first threshold value at the first time point, then decreases to less than the first threshold value and exceeds the first threshold value again and the amount of time from the first time point to a point of exceeding the first threshold value again is within the first period and longer than the second period that is shorter than the first period, and
if the index value does not exceed the second threshold value greater than the first threshold value.

* * * * *